(12) United States Patent
Aida (10) Patent No.: US 12,224,187 B2
(45) Date of Patent: Feb. 11, 2025

(54) SUBSTRATE PROCESSING APPARATUS FOR MANUFACTURING SEMICONDUCTOR DEVICE

(71) Applicant: Kioxia Corporation, Tokyo (JP)

(72) Inventor: Makoto Aida, Yatomi Aichi (JP)

(73) Assignee: Kioxia Corporation, Tokyo (JP)

( * ) Notice: Subject to any disclaimer, the term of this patent is extended or adjusted under 35 U.S.C. 154(b) by 133 days.

(21) Appl. No.: 17/693,605

(22) Filed: Mar. 14, 2022

(65) Prior Publication Data

US 2023/0063662 A1 Mar. 2, 2023

(30) Foreign Application Priority Data

Aug. 27, 2021 (JP) ................................. 2021-138651

(51) Int. Cl.
*H01L 21/67* (2006.01)
*H01L 21/311* (2006.01)

(52) U.S. Cl.
CPC .... *H01L 21/6708* (2013.01); *H01L 21/31133* (2013.01); *H01L 21/67259* (2013.01)

(58) Field of Classification Search
None
See application file for complete search history.

(56) References Cited

U.S. PATENT DOCUMENTS

| | | | | |
|---|---|---|---|---|
| 5,271,796 A * | 12/1993 | Miyashita | ............... | C30B 33/00 252/79.5 |
| 5,665,200 A * | 9/1997 | Fujimoto | ............ | H01L 21/6715 430/323 |
| 6,071,376 A * | 6/2000 | Nagamura | ................ | G03F 1/82 134/1.1 |
| 7,799,166 B2 * | 9/2010 | Whitefield | .............. | H01L 21/68 156/345.55 |
| 9,799,540 B2 * | 10/2017 | Oono | ................... | H01L 21/6708 |
| 10,727,090 B2 | 7/2020 | Kikumoto et al. | | |
| 10,903,101 B2 * | 1/2021 | Komatsu | ........... | H01L 21/67288 |
| 11,664,243 B2 * | 5/2023 | Park | .................... | H01L 21/6708 156/345.23 |

(Continued)

FOREIGN PATENT DOCUMENTS

JP 2001-71163 A 3/2001
JP 2001-110712 A 4/2001

(Continued)

*Primary Examiner* — Sylvia Macarthur
(74) *Attorney, Agent, or Firm* — Finnegan, Henderson, Farabow, Garrett & Dunner, LLP (57) ABSTRACT

A substrate processing apparatus according to the embodiment includes: a substrate holding unit that holds a substrate; a rotation support unit that supports the substrate holding unit and rotates the substrate n a circumferential direction; a drive unit that drives the substrate holding unit with respect to the rotation support unit in a plane direction of the substrate; a detection unit that detects an outer edge portion of the substrate; a chemical liquid discharge unit that discharges a chemical liquid to the outer edge portion of the substrate; and a control unit that causes the drive unit to drive the substrate holding unit based on the outer edge portion detected by the detection unit in a manner that a center position in a plane of the substrate matches a rotation axis of the rotation support unit.

14 Claims, 5 Drawing Sheets

(56) References Cited

U.S. PATENT DOCUMENTS

| | | | |
|---|---|---|---|
| 2008/0216959 A1* | 9/2008 | Kobayashi | H01L 21/67069 |
| | | | 156/345.55 |
| 2011/0281376 A1 | 11/2011 | Amano | |
| 2015/0101752 A1* | 4/2015 | Tada | B24B 9/065 |
| | | | 156/345.13 |
| 2018/0231952 A1* | 8/2018 | Kuwahara | G05B 19/19 |
| 2018/0299780 A1* | 10/2018 | Kuwahara | B08B 13/00 |
| 2018/0350632 A1 | 12/2018 | Kikumoto et al. | |
| 2023/0063662 A1* | 3/2023 | Aida | H01L 21/67259 |

FOREIGN PATENT DOCUMENTS

| | | |
|---|---|---|
| JP | 2011-258925 A | 12/2011 |
| JP | 2012-209361 A | 10/2012 |
| JP | 2014-27298 A | 2/2014 |
| JP | 2018-206877 A | 12/2018 |
| TW | 202046400 A | 12/2020 |
| WO | WO 2020/084938 A1 | 4/2020 |
| WO | WO 2020/137803 A1 | 7/2020 |

* cited by examiner

SUBSTRATE PROCESSING APPARATUS FOR MANUFACTURING SEMICONDUCTOR DEVICE

CROSS-REFERENCE TO RELATED APPLICATIONS

This application is based upon and claims the benefit of priority from Japanese Patent Application No. 2021-138651, filed on Aug. 27, 2021; the entire contents of which are incorporated herein by reference.

FIELD

Embodiments described herein relate generally to a substrate processing apparatus and a method for manufacturing a semiconductor device.

BACKGROUND

In a manufacturing process of a semiconductor device, processing of discharging a chemical liquid to an outer edge portion of a substrate may be performed. In the processing of discharging a chemical liquid, the substrate is held on the substrate holding unit, and the chemical liquid is discharged in the circumferential direction of the substrate while rotating the substrate together with the substrate holding unit. As a result, an annular film is formed on the outer edge portion of the substrate, or a part of the film on the substrate is removed to expose the outer edge portion of the substrate.

However, there is a case where the substrate is placed on the substrate holding unit in a state where the center position in the substrate plane does not match the rotation axis of the substrate at the time of processing of discharging a chemical liquid. In this case, the width of the film formed on the substrate outer edge portion or the exposed width of the substrate outer edge portion varies in the circumferential direction of the substrate.

BRIEF DESCRIPTION OF THE DRAWINGS

FIGS. 4Aa to 4Bd are diagrams illustrating an example of a procedure of position correction processing of the wafer in the substrate processing apparatus according to the embodiment;

FIGS. 5Aa to 5Bb are schematic views of a wafer processed by the substrate processing apparatus according to the embodiment;

FIGS. 6Aa to 6Bb are schematic views of a wafer processed by a substrate processing apparatus according to a comparative example;

DETAILED DESCRIPTION

A substrate processing apparatus according to the embodiment includes: a substrate holding unit that holds a substrate; a rotation support unit that supports the substrate holding unit and rotates the substrate held by the substrate holding unit in a circumferential direction; a drive unit that drives the substrate holding unit with respect to the rotation support unit in a plane direction of the substrate; a detection unit that detects an outer edge portion of the substrate held by the substrate holding unit; a chemical liquid discharge unit that discharges a chemical liquid to the outer edge portion of the substrate held by the substrate holding unit; and a control unit that causes the drive unit to drive the substrate holding unit based on the outer edge portion detected by the detection unit in a manner that a center position in a plane of the substrate held by the substrate holding unit matches a rotation axis of the rotation support unit.

Hereinafter, non-limiting exemplary embodiments of the present invention will be described in detail with reference to the drawings. Note that the present invention is not limited by the following embodiments. In addition, constituent elements in the following embodiments include those that can be easily assumed by those skilled in the art or those that are substantially the same.

(Configuration Example of Substrate Processing Apparatus)

Figure 1:
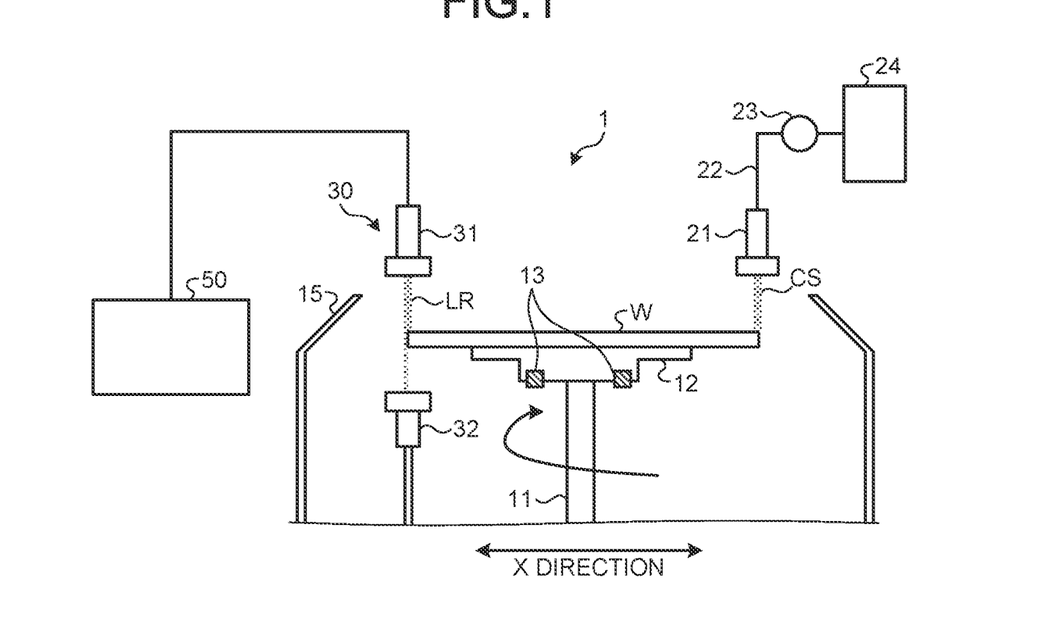
FIG. 1 is a diagram illustrating an example of a configuration of a substrate processing apparatus according to an embodiment.

FIG. 1 is a diagram illustrating an example of a configuration of a substrate processing apparatus 1 according to an embodiment. The substrate processing apparatus 1 of the embodiment is configured as a chemical liquid discharge apparatus that discharges a chemical liquid to an outer edge portion of a wafer W as a substrate.

As illustrated in FIG. 1, the substrate processing apparatus 1 includes a rotation support unit 11, a substrate holding unit 12, a drive unit 13, a cup 15, a chemical liquid nozzle 21, a supply pipe 22, a valve 23, a chemical liquid tank 24, a detection unit 30, and a control unit 50.

The rotation support unit 11 includes a rotary motor (not illustrated), and rotatably supports the substrate holding unit 12 connected to the upper end of the rotation support unit 11. As a result, the rotation support unit 11 rotates the wafer W held by the substrate holding unit 12 in the circumferential direction of the wafer W together with the substrate holding unit 12.

The substrate holding unit 12 has, for example, a circular flat placement surface, and is configured to be able to hold the wafer W on the placement surface.

The drive unit 13 is provided at a lower end of the substrate holding unit 12 and at a connection portion with the rotation support unit 11. The drive unit 13 includes, for example, a stepping motor (not illustrated) and the like, and drives the substrate holding unit 12 in the plane direction of the wafer W.

In addition, a lock mechanism (not illustrated) is provided in the rotation support unit 11, the substrate holding unit 12, and the drive unit 13. The lock mechanism fixes the position of the wafer W in the plane direction of the wafer W with respect to the substrate holding unit 12, and fixes the position of the substrate holding unit 12 in the plane direction of the wafer W with respect to the rotation support unit 11. A detailed configuration of the lock mechanism will be described later.

The chemical liquid nozzle 21 as a chemical liquid discharge unit is disposed above the outer edge portion of the wafer W supported by the substrate holding unit 12, and discharges a chemical liquid CS to the outer edge portion of the wafer W. The chemical liquid nozzle 21 is connected to one end on the downstream side of the supply pipe 22 that supplies the chemical liquid to the substrate processing apparatus 1.

The supply pipe 22 is provided with the valve 23, and one end on the upstream side of the supply pipe 22 is connected to the chemical liquid tank 24.

A chemical liquid is stored in the chemical liquid tank 24. The chemical liquid stored in the chemical liquid tank 24 is, for example, a removal liquid for removing a film such as a resin film on the wafer W, or a raw material liquid as a raw material of a film such as a resin film formed on the wafer W.

As described above, various chemical liquids can be stored in the chemical liquid tank 24 in accordance with the processing contents for the wafer W. That is, the content of processing on the wafer W can be appropriately changed in accordance with the chemical liquid stored in the chemical liquid tank 24.

For example, when the removal liquid is stored in the chemical liquid tank 24, processing of removing a part of the film formed on the wafer W to expose the outer edge portion of the wafer W can be performed. In addition, for example, when the raw material liquid is stored in the chemical liquid tank 24, processing of forming an annular film on the outer edge portion of the wafer W can be performed.

The chemical liquid is pumped to the chemical liquid nozzle 21 through the chemical liquid tank 24, the valve 23, and the supply pipe 22 by a pump (not illustrated) or the like. When the chemical liquid is discharged from the chemical liquid nozzle 21 to the outer edge portion of the wafer W, the wafer W is rotated by the rotation support unit 11. As a result, the surplus chemical liquid discharged to the outer edge portion of the wafer W is shaken off from the wafer W by the centrifugal force.

The cup 15 is disposed to surround the rotation support unit 11 and the substrate holding unit 12. The upper end of the cup 15 protrudes upward to the outer edge portion of the wafer W held by the substrate holding unit 12.

As a result, since the chemical liquid shaken off from the wafer W by the centrifugal force is received by the cup 15, it is possible to suppress scattering of the chemical liquid to the surroundings. In addition, the chemical liquid received by the cup 15 can be recovered and reused.

The detection unit 30 is provided in the vicinity of the outer edge portion of the wafer W at a position away from the chemical liquid nozzle 21 in the circumferential direction of the wafer W, and detects the outer edge portion of the wafer W. In the example of FIG. 1, the detection unit 30 is disposed at a position 180° away from the chemical liquid nozzle 21 in the circumferential direction of the wafer W. A direction along the plane of the wafer W and from the chemical liquid nozzle 21 toward the detection unit 30 is defined as an X direction, for example.

In the initial state before the processing of the wafer W is started, for example, the center position of the substrate holding unit 12 in the plane direction of the wafer W and the rotation axis of the rotation support unit 11 are positioned on a line connecting the chemical liquid nozzle 21 and the detection unit 30.

The detection unit 30 is a laser sensor or the like including a light projecting unit 31 and a light receiving unit 32. The light projecting unit 31 is provided above the outer edge portion of the wafer W, and projects a laser light LR toward the outer edge portion of the wafer W. The light receiving unit 32 is provided below the outer edge portion of the wafer W and at a position facing the light projecting unit 31, and receives the laser light LR from the light projecting unit 31.

The control unit 50 is configured as a computer including, for example, a central processing unit (CPU), a read only memory (ROM), a random access memory (RAM), and the like, and controls each part of the substrate processing apparatus 1.

That is, the control unit 50 controls a rotary motor (not illustrated) to rotate the rotation support unit 11. In addition, the control unit 50 controls the drive unit 13 to drive the substrate holding unit 12. In addition, the control unit 50 controls a lock mechanism (not illustrated) to fix the positions of the wafer W and the substrate holding unit 12. In addition, the control unit 50 controls the opening and closing of the valve 23 to control the supply of the chemical liquid to the wafer W. In addition, the control unit 50 controls the detection unit 30 to detect the outer edge portion of the wafer W.

In addition, the control unit 50 may include a storage device (not illustrated). The storage device may store, for example, control parameters of the substrate processing apparatus 1, position information of the outer edge portion of the wafer W detected by the detection unit 30, and the like.

Figures 2A, 2B:
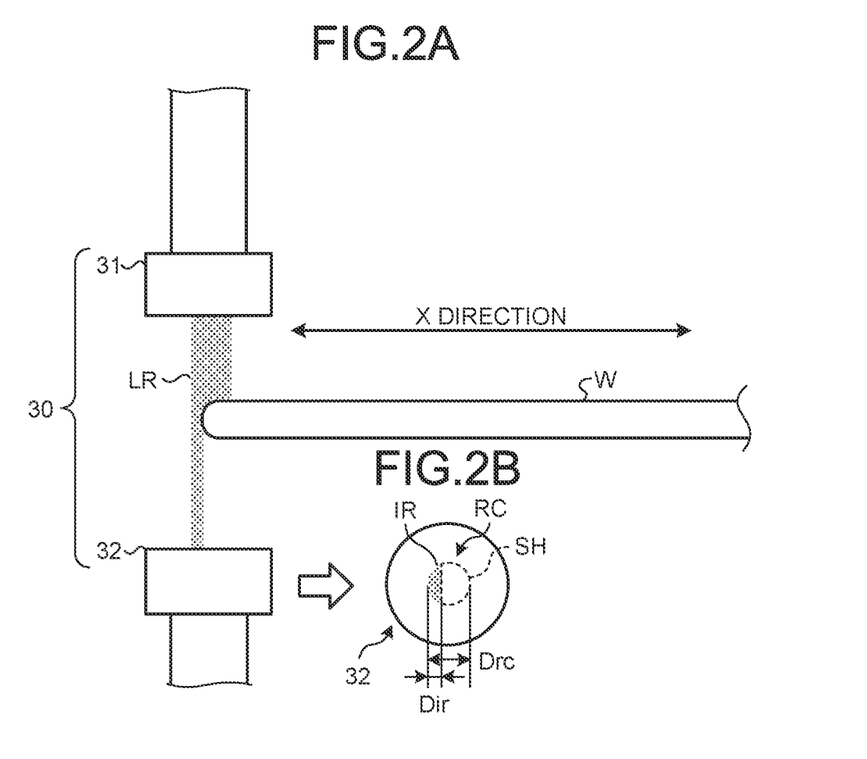
FIGS. 2A and 2B are diagrams illustrating an example of a method for detecting an outer edge portion of a wafer by a detection unit included in the substrate processing apparatus according to the embodiment.

FIGS. 2A and 2B are diagrams illustrating an example of a method for detecting the outer edge portion of the wafer W by the detection unit 30 included in the substrate processing apparatus 1 according to the embodiment.

When the wafer W is carried into the substrate processing apparatus 1, the wafer W may be placed on the substrate holding unit 12 in a state where the center position in the plane of the wafer W does not match the rotation axis of the rotation support unit 11. When the wafer W is placed on the substrate holding unit 12, the control unit 50 of the substrate processing apparatus 1 causes the detection unit 30 to detect the position of the outer edge portion of the wafer W before the processing of discharging the chemical liquid onto the wafer W.

As illustrated in FIG. 2A, in detecting the outer edge portion of the wafer W, the laser light LR is projected from the light projecting unit 31 of the detection unit 30 from above the wafer W placed on the substrate holding unit 12 toward the outer edge portion of the wafer W. The laser light LR is received by the light receiving unit 32 provided below the wafer W to face the light projecting unit 31.

At this time, a part of the laser light LR from the light projecting unit 31 is blocked by the outer edge portion of the wafer W in accordance with the placement position of the wafer W in the substrate holding unit 12, and the laser light LR that has passed through the outside of the outer edge portion of the wafer W reaches the light receiving unit 32 without being blocked.

As illustrated in FIG. 2B, at this time, a light receiving region RC of the light receiving unit 32 includes an irradiation region IR in which the laser light LR is received and a light blocking region SH in which the laser light LR is not received. The control unit 50 specifies the position of the outer edge portion of the wafer W based on a width Dir in the X direction of the irradiation region IR with respect to a width Drc in the X direction of the light receiving region RC, that is, the width in the X direction of the laser light LR received by the light receiving unit 32.

More specifically, the control unit 50 can calculate the position in the X direction of the outer edge portion of the wafer W with respect to the detection unit 30 from the width in the X direction of the laser light LR received by the light receiving unit 32.

In addition, the positional relationship between the rotation support unit 11 below the wafer W and the detection unit 30 is fixed in the substrate processing apparatus 1, and the position of the detection unit 30 in the X direction with respect to the rotation support unit 11 is known. In addition, the diameter of the wafer W is known, and the distance from the outer edge portion of the wafer W to the center position corresponds to the radius of the wafer W.

Therefore, the control unit 50 can calculate the center position in the plane of the wafer W with respect to the rotation axis of the rotation support unit 11 from the position in the X direction of the outer edge portion of the wafer W with respect to the detection unit 30. At this time, by detecting the outer edge portion of the wafer W at a plurality of places in the circumferential direction of the wafer W, for example, at three or more places, the center position in the plane of the wafer W with respect to the rotation axis of the rotation support unit 11 can be calculated more accurately.

As described above, in the initial state before the chemical liquid discharge processing is started, for example, the center position of the substrate holding unit 12 in the plane direction of the wafer W exists on a line connecting the chemical liquid nozzle 21 and the detection unit 30. Therefore, the width in the X direction of the laser light LR received by the light receiving unit 32 corresponds to the width in the direction toward the center position of the substrate holding unit 12 in the laser light LR.

Figure 3A:
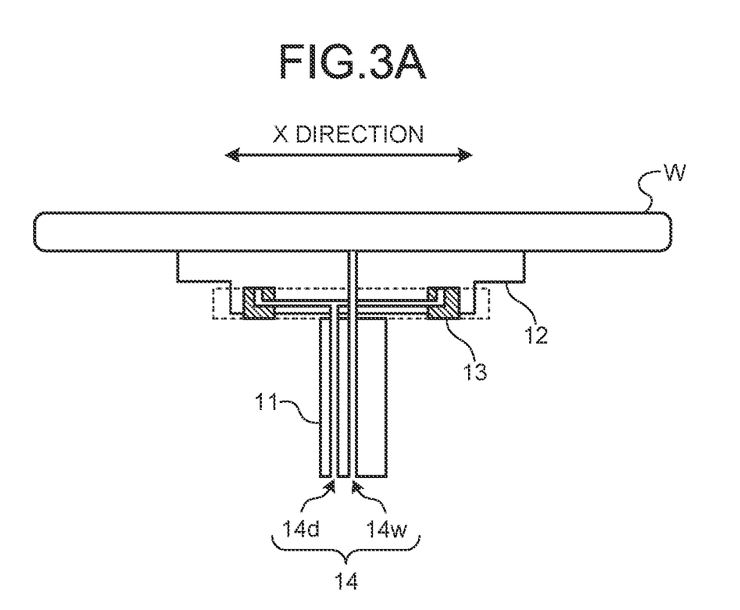
FIGS. 3A and 3B are diagrams illustrating an example of a configuration of a lock mechanism included in the substrate processing apparatus according to the embodiment.
Figure 3B:
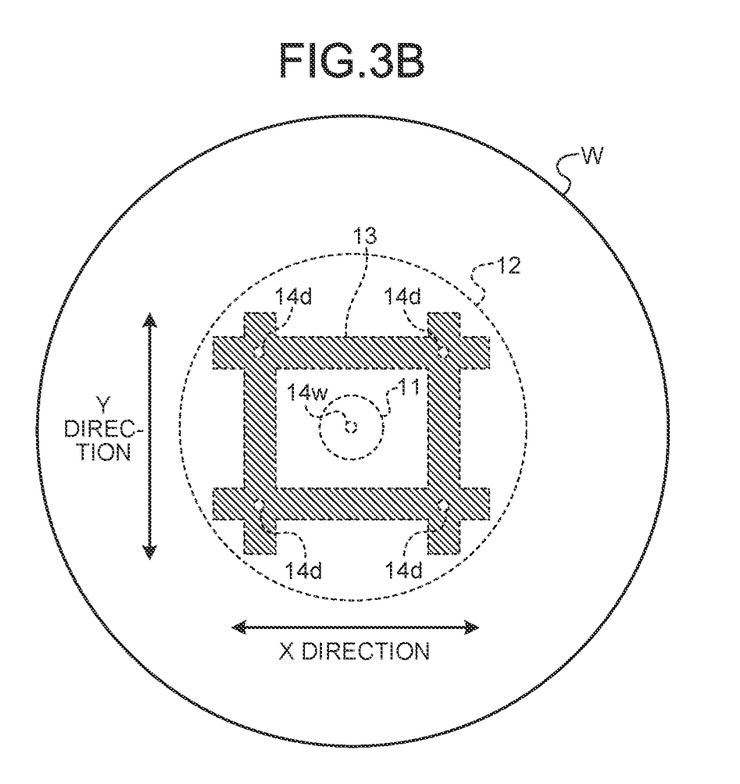

FIGS. 3A and 3B are diagrams illustrating an example of a configuration of a lock mechanism 14 included in the substrate processing apparatus 1 according to the embodiment. FIG. 3A is a cross-sectional view along the X direction of the wafer W placed on the substrate holding unit 12. FIG. 3B is a perspective top view of the wafer W placed on the substrate holding unit 12.

The X direction as the first direction and a Y direction as the second direction illustrated in FIGS. 3A and 3B are both directions along the plane of the wafer W and are orthogonal to each other. As described above, for example, the direction connecting the chemical liquid nozzle 21 and the detection unit 30 can be the X direction.

As illustrated in FIGS. 3A and 3B, the substrate holding unit 12 has, for example, a circular shape similarly to the wafer W. The diameter of the placement surface of the substrate holding unit 12 is preferably designed to be as large as possible. As a result, bending of the wafer W held by the substrate holding unit 12 can be suppressed.

However, it is assumed that the diameter of the placement surface of the substrate holding unit 12 is less than the diameter of the wafer W. That is, the area of the placement surface of the substrate holding unit 12 is smaller than the area of the upper surface of the wafer W, which is the plane from which the chemical liquid is discharged. As a result, it is possible to suppress adhesion of the chemical liquid to the placement surface and to smoothly shake off the surplus chemical liquid from the outer edge portion of the wafer W.

The drive unit 13 is fixed to the rotation support unit 11 and provided in a parallel cross shape at a connection portion between the substrate holding unit 12 and the rotation support unit 11, and drives the substrate holding unit 12 at least in the X direction and the Y direction by a stepping motor (not illustrated) or the like.

That is, the drive unit 13 includes a pair of members extending in the X direction and the Y direction. These members are combined in a parallel cross shape, and drive the substrate holding unit 12 in the X direction and the Y direction along these members.

However, the drive unit 13 may be capable of moving the position of the substrate holding unit 12 in the circumferential direction of the wafer W in addition to the X direction and the Y direction.

The driving amount of the drive unit 13 may be, for example, within 1 mm in each of the X direction and the Y direction. Since the driving by the drive unit 13 is performed by, for example, a stepping motor or the like, the substrate holding unit 12 can be driven with high accuracy in units of 1 mm or less.

With such a configuration, the position of the substrate holding unit 12 with respect to the rotation support unit 11 can be moved. In addition, along with the movement of the substrate holding unit 12, the center position in the plane of the wafer W held by the substrate holding unit 12 can be moved with respect to the rotation axis of the rotation support unit 11.

The lock mechanism 14 includes two-system vacuum chucks 14*w* and 14*d*. The vacuum chuck 14*w* fixes the position of the wafer W in the plane direction with respect to the substrate holding unit 12. The vacuum chuck 14*d* fixes the position of the substrate holding unit 12 in the plane direction of the wafer W with respect to the rotation support unit 11.

More specifically, the vacuum chuck 14*w* as the first lock mechanism penetrates the substrate holding unit 12 from the rotation support unit 11 on the rotation axis of the rotation support unit 11, for example, and extends to the back surface of the wafer W. The vacuum chuck 14*w* is configured as a first chucking mechanism that chucks the wafer W to the substrate holding unit 12 by sucking the back surface of the wafer W by a pump (not illustrated).

The vacuum chuck 14*w* extending from the rotation support unit 11 to the substrate holding unit 12 has flexibility at a connection portion between the rotation support unit 11 and the substrate holding unit 12. That is, a portion of the vacuum chuck 14*w* extending from the rotation support unit 11 to the substrate holding unit 12 is configured as, for example, a flexible resin tube.

In addition, the vacuum chuck 14*d* as the second lock mechanism penetrates the drive unit 13 from the rotation support unit 11 and extends to the back surface of the substrate holding unit 12. In the rotation support unit 11, the vacuum chuck 14*d* extends, for example, on the rotation axis. In the example of FIGS. 3A and 3B, the upper end of the vacuum chuck 14*d* reaches the intersection position of the member extending in the X direction and the member extending in the Y direction of the drive unit 13 having a parallel cross shape.

The vacuum chuck 14*d* is configured as a second chucking mechanism that chucks the substrate holding unit 12 to the drive unit 13 by sucking the back surface of the substrate holding unit 12 by a pump (not illustrated).

As described above, the position of the drive unit 13 is fixed with respect to the rotation support unit 11. Therefore, by causing the vacuum chuck 14*d* to chuck the substrate holding unit 12 to the drive unit 13, the position of the substrate holding unit 12 is fixed with respect to the rotation support unit 11.

At the time of processing the wafer W in the substrate processing apparatus 1, the control unit 50 appropriately executes locking and unlocking of the wafer W to the substrate holding unit 12 by the vacuum chuck 14*w*, and locking and unlocking of the substrate holding unit 12 to the drive unit 13 and the rotation support unit 11 by the vacuum chuck 14*d* at a predetermined timing.

(Method for Manufacturing a Semiconductor Device)

Next, a method for manufacturing a semiconductor device of the embodiment will be described with reference to FIGS. 4Aa to 5Bb. The method for manufacturing a semiconductor device of the embodiment includes processing of discharging a chemical liquid to the outer edge portion of the wafer W in the substrate processing apparatus 1. The substrate processing apparatus 1 performs position correction processing of aligning the center position in the plane of the wafer W with the rotation axis of the rotation support unit 11 prior to the processing of discharging a chemical liquid.

Figure 4:
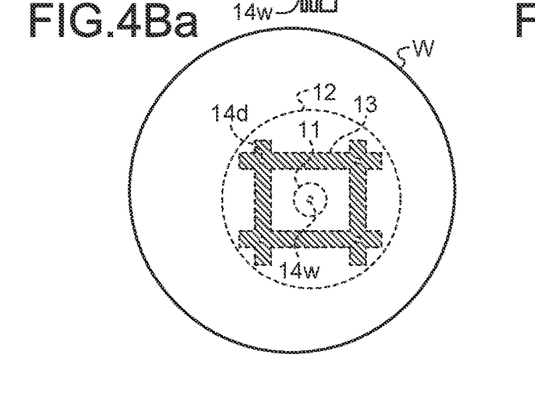
Figure 5:
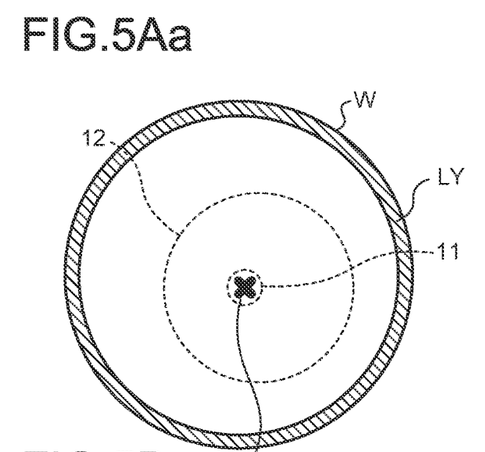

FIGS. 4Aa to 4Bd are diagrams illustrating an example of a procedure of position correction processing of the wafer W in the substrate processing apparatus 1 according to the embodiment. FIGS. 4Aa to 4Ad are cross-sectional views along the X direction of the wafer W placed on the substrate holding unit 12. FIGS. 4Ba to 4Bd correspond to FIGS. 4Aa to 4Ad, respectively, and are perspective top views of the wafer W placed on the substrate holding unit 12.

As illustrated in FIGS. 4Aa and 4Ba, the wafer W is carried into the substrate processing apparatus 1 and placed on the substrate holding unit 12. In the examples of FIGS. 4Aa and 4Ba, at this time, it is assumed that the wafer W is placed with a center position Cw in the plane shifted in the X direction and the Y direction with respect to a rotation axis Cr of the rotation support unit 11.

More specifically, the center position Cw in the plane of the wafer W is shifted to the left of the page in the X direction, that is, to the detection unit 30 at a position between the detection unit 30 and the chemical liquid nozzle 21. In addition, the center position Cw in the plane of the wafer W is shifted toward the top of the page in the Y direction. However, the actual shift amount of the wafer W at the time of carrying in is, for example, a minute amount of 1 mm or less.

When the wafer W is carried in, the drive unit 13 is at the initial position, and the center position of the substrate holding unit 12 in the plane direction of the wafer W matches the rotation axis Cr of the rotation support unit 11.

As illustrated in FIGS. 4Ab and 4Bb, the control unit 50 causes the detection unit 30 to detect the outer edge portion of the wafer W in a state where the relative positions of the wafer W, the substrate holding unit 12, the drive unit 13, and the rotation support unit 11 are locked.

That is, the control unit 50 causes the vacuum chuck 14*w* to chuck the back surface of the wafer W to the substrate holding unit 12, and fixes the position of the wafer W in the plane direction to the substrate holding unit 12. In addition, the control unit 50 causes the vacuum chuck 14*d* to chuck the back surface of the substrate holding unit 12 to the drive unit 13, and fixes the position of the substrate holding unit 12 to the drive unit 13 and the rotation support unit 11 in the plane direction of the wafer W.

In addition, the control unit 50 causes the detection unit 30 to detect the position of the outer edge portion of the wafer W at a plurality of places in the circumferential direction of the wafer W while rotating the wafer W held by the substrate holding unit 12 at a low speed by, for example, the rotation support unit 11 in a state where the relative positions of the wafer W, the substrate holding unit 12, the drive unit 13, and the rotation support unit 11 are fixed.

In addition, the control unit 50 calculates the center position Cw in the plane of the wafer W with respect to the rotation axis Cr of the rotation support unit 11 at least in the X direction and the Y direction based on the detection position of the outer edge portion of the wafer W by the detection unit 30.

In the examples of FIGS. 4Ab and 4Bb, the control unit 50 calculates the center position Cw in the X direction in the plane of the wafer W as a value shifted to the left of the page with respect to the rotation axis Cr of the rotation support unit 11. In addition, the control unit 50 calculates the center position Cw in the Y direction in the plane of the wafer W as a value shifted to the top of the page with respect to the rotation axis Cr of the rotation support unit 11.

As illustrated in FIGS. 4Ac and 4Bc, after unlocking the substrate holding unit 12, the control unit 50 drives the substrate holding unit 12 by the drive unit 13 to match the center position Cw in the plane of the wafer W with respect to the rotation axis Cr of the rotation support unit 11.

That is, the control unit 50 stops the chucking of the back surface of the substrate holding unit 12 to the drive unit 13 by the vacuum chuck 14*d*, and releases the position fixation of the substrate holding unit 12 to the drive unit 13 and the rotation support unit 11. In addition, the control unit 50 continues to cause the substrate holding unit 12 to chuck the back surface of the wafer W by the vacuum chuck 14*w*, and maintains a state where the wafer W is fixed to the substrate holding unit 12.

As a result, the substrate holding unit 12 can be freely moved in the plane direction of the wafer W with respect to the drive unit 13 and the rotation support unit 11. On the other hand, the relative position of the wafer W held by the substrate holding unit 12 with respect to the substrate holding unit 12 can be maintained while being fixed.

In addition, the control unit 50 drives the substrate holding unit 12 in the plane direction of the wafer W by the drive unit 13 in a manner that the center position Cw in the plane of the wafer W matches the rotation axis Cr of the rotation support unit 11 based on the calculation result of the center position Cw in the plane of the wafer W with respect to the rotation axis Cr of the rotation support unit 11.

As described above, the drive unit 13 moves the wafer W held by the substrate holding unit 12 together with the substrate holding unit 12 without changing the relative position between the substrate holding unit 12 and the wafer W. As a result, the center position Cw in the plane of the wafer W and the rotation axis Cr of the rotation support unit 11 substantially match each other.

At this time, the center position of the substrate holding unit 12 in the plane direction of the wafer W moves to a position shifted in the X direction and the Y direction from the rotation axis Cr of the rotation support unit 11. On the other hand, the vacuum chuck 14*w* has flexibility at a connection position between the rotation support unit 11 and the substrate holding unit 12.

Therefore, after penetrating the rotation support unit 11 on the rotation axis Cr, the vacuum chuck 14*w* bends following the substrate holding unit 12 having a center position deviated from the rotation axis Cr, and penetrates the substrate holding unit 12 to reach the back surface of the wafer W.

As illustrated in FIGS. 4Ad and 4Bd, the control unit 50 starts chucking of the back surface of the substrate holding unit 12 to the drive unit 13 again by the vacuum chuck 14*d*. As a result, the position of the substrate holding unit 12 is fixed to the rotation support unit 11 in a state where the center position Cw in the plane of the wafer W and the rotation axis Cr of the rotation support unit 11 substantially match each other.

After this, the substrate processing apparatus 1 performs processing of discharging the chemical liquid onto the wafer W while maintaining a state where the center position Cw in the plane of the wafer W and the rotation axis Cr of the rotation support unit 11 substantially match each other. In addition, after the chemical liquid is discharged, the rotation of the wafer W is continued for a predetermined time, and spin drying processing of drying the chemical liquid discharged to the wafer W is performed.

FIGS. 5Aa to 5Bb are schematic views of the wafer W processed by the substrate processing apparatus 1 according to the embodiment.

FIG. 5Aa is a top view of the wafer W subjected to the processing of forming an annular film LY, and FIG. 5Ba is a cross-sectional view of the wafer W of FIG. 5Aa in the X direction. FIG. 5Ba is a top view of the wafer W subjected to the processing of exposing the outer edge portion, and FIG. 5Bb is a cross-sectional view of the wafer W of FIG. 5Ba in the X direction.

Note that FIGS. 5Aa and 5Ab illustrate the positional relationship between the wafer W, the substrate holding unit 12, and the rotation support unit 11 at the time of the processing of discharging a chemical liquid, and the center position Cw in the plane of the wafer W and the rotation axis Cr of the rotation support unit 11. In the examples of FIGS. 5Aa and 5Ab, it is assumed that the wafer W is processed in a state where the rotation axis Cr of the rotation support unit 11 and the center position Cw in the plane of the wafer W match each other.

As illustrated in FIGS. 5Aa and 5Ba, for example, when the raw material liquid is discharged from the chemical liquid nozzle 21, the annular film LY is formed with a predetermined width at the outer edge portion of the wafer W. Since the raw material liquid is discharged from the chemical liquid nozzle 21 to the outer edge portion of the wafer W in a state where the center position Cw in the plane of the wafer W and the rotation axis Cr of the rotation support unit 11 substantially match each other, the film LY having a substantially uniform width is formed.

Such the annular film LY is used, for example, as a protective film or the like for the outer edge portion of the wafer W. That is, for example, when etching processing or the like is performed on the wafer W after this, it is suppressed that even the outer edge portion of the wafer W is etched.

As illustrated in FIGS. 5Ab and 5Bb, for example, when the removal liquid is discharged from the chemical liquid nozzle 21, for example, the film LY formed on the entire surface of the wafer W is removed from the outer edge portion of the wafer W, and an exposed portion EX in which the upper surface of the wafer W is exposed with a predetermined width is formed. Since the removal liquid is discharged from the chemical liquid nozzle 21 to the outer edge portion of the wafer W in a state where the center position Cw in the plane of the wafer W and the rotation axis Cr of the rotation support unit 11 substantially match each other, the exposed portion EX has a substantially uniform width.

Such processing is performed to suppress particles and the like in the outer edge portion of the wafer W. That is, by removing the film LY from the outer edge portion of the wafer W, for example, at the time of handling the wafer W, it is suppressed that the film LY at the outer edge portion peels off and becomes a particle source.

As the film LY illustrated in FIGS. 5Aa to 5Bb, films of various film types can be applied. The film LY may be, for example, a resist film, a resin film such as a spin on carbon (SOC) film or a chemical vapor deposition (CVD) carbon film, or an inorganic film such as a spin on glass (SOG) film.

After this, the semiconductor device of the embodiment is manufactured by performing various processes on the wafer W.

Comparative Example

In a manufacturing process of a semiconductor device, processing of discharging a chemical liquid to an outer edge portion of a wafer to form an annular film or to expose the outer edge portion of the wafer may be performed. The processing of discharging a chemical liquid is performed in a state where the wafer is rotated. However, there is a case where the wafer is carried into the substrate processing apparatus in a state where the center position in the plane of the wafer does not match the rotation axis when the wafer is rotated due to conveyance deviation or the like.

Figure 6:
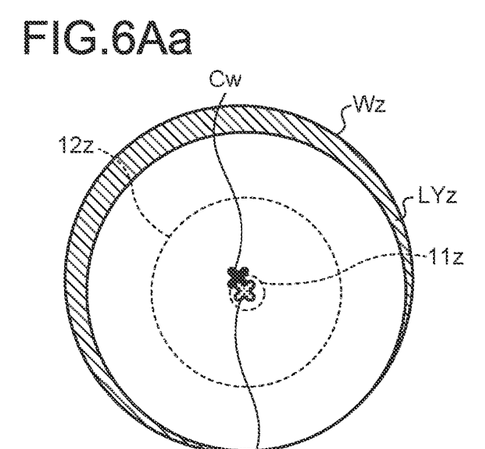

FIGS. 6Aa to 6Bb illustrate examples of a wafer Wz processed in a state where the center position Cw of the wafer Wz and the rotation axis Cr are shifted from each other. FIGS. 6Aa to 6Bb are schematic views of the wafer Wz processed by a substrate processing apparatus according to a comparative example.

In the substrate processing apparatus of the comparative example, a substrate holding unit 12z, a rotation support unit 11z, and the like are not provided with a mechanism for correcting the position of the wafer Wz. Therefore, in the substrate processing apparatus of the comparative example, the processing of discharging a chemical liquid is performed in a state where the center position Cw of the wafer Wz and the rotation axis Cr are shifted from each other.

That is, in the substrate processing apparatus of the comparative example, when the wafer Wz is rotated, the wafer Wz is eccentric with respect to the rotation axis Cr. As a result, with the rotation of the wafer Wz, the position of the outer edge portion of the wafer Wz passing below the chemical liquid nozzle varies, and the discharge width of the chemical liquid at the outer edge portion of the wafer Wz varies.

As illustrated in FIGS. 6Aa and 6Ba, for example, when the raw material liquid is discharged from the chemical liquid nozzle, an annular film LYz is formed at the outer edge portion of the wafer Wz. However, since the center position Cw of the wafer Wz and the rotation axis Cr are misaligned, the discharge width of the raw material liquid varies, and the width of the formed film LYz also varies.

As illustrated in FIGS. 6Ab and 6Bb, for example, when the removal liquid is discharged from the chemical liquid nozzle, the film LYz formed on the entire surface of the wafer Wz is removed from the outer edge portion of the wafer Wz, and an exposed portion EXz in which the upper surface of the wafer Wz is exposed is formed. However, since the center position Cw of the wafer Wz and the rotation axis Cr are misaligned, the discharge width of the removal liquid varies, and the width of the exposed portion EXz also varies.

In a case where a misalignment occurs between the center position Cw of the wafer Wz and the rotation axis Cr, in order to suppress the processing failure as described above, for example, it is conceivable to take measures such as reconveying the wafer Wz and replacing the wafer Wz on the substrate holding unit 12z. However, in this case, the processing time of the wafer Wz may be prolonged due to reconveyance or the like, and the throughput of the substrate processing apparatus may be reduced.

According to the substrate processing apparatus 1 of the embodiment, the substrate holding unit 12 is driven by the drive unit 13 based on the position of the outer edge portion of the wafer W detected by the detection unit 30 in a manner that the center position in the plane of the wafer W held by the substrate holding unit 12 matches the rotation axis of the rotation support unit 11.

As a result, it is possible to suppress variations in the width of the film LY formed on the outer edge portion of the wafer W and the exposed width of the outer edge portion of the wafer W. In addition, since the drive target of the drive unit 13 is the substrate holding unit 12 and the position of the wafer W is corrected before the wafer W is processed, it is possible to suppress an increase in size of the substrate processing apparatus 1 without requiring a large-scale mechanism. In addition, since it is not necessary to reconvey the wafer W, for example, the throughput of the substrate processing apparatus 1 can be improved, for example.

The substrate processing apparatus 1 of the embodiment includes the two-system lock mechanism 14 including the vacuum chuck 14w that fixes the position of the wafer in the plane direction with respect to the substrate holding unit 12 and the vacuum chuck 14d that fixes the position of the substrate holding unit 12 in the plane direction of the wafer W with respect to the rotation support unit 11.

As a result, the relative positions of the wafer W, the substrate holding unit 12, and the rotation support unit 11 can be appropriately fixed or released in each of the detection processing of the outer edge portion of the wafer W, the position correction processing of the wafer W, and the processing of discharging a chemical liquid.

According to the substrate processing apparatus 1 of the embodiment, the vacuum chuck 14w has flexibility in the connection portion between the rotation support unit 11 and the substrate holding unit 12. As a result, even if the relative position of the substrate holding unit 12 with respect to the rotation support unit 11 is changed by the position correction processing of the wafer W, the wafer W can be chucked to the substrate holding unit 12.

According to the substrate processing apparatus 1 of the embodiment, when the outer edge portion of the wafer W is detected by the detection unit 30, the position of the wafer W is fixed with respect to the substrate holding unit 12 by the vacuum chuck 14w, and the position of the substrate holding unit 12 is fixed with respect to the rotation support unit 11 by the vacuum chuck 14d. As a result, the position of the wafer W is prevented from varying during the detection processing, and the center position in the plane of the outer edge portion of the wafer W can be specified with high accuracy.

According to the substrate processing apparatus 1 of the embodiment, when the center position in the plane of the wafer W and the rotation axis of the rotation support unit 11 are aligned by the drive unit 13, the position of the wafer W is fixed with respect to the substrate holding unit 12 by the vacuum chuck 14w, and the position of the substrate holding unit 12 is not fixed with respect to the rotation support unit 11 by releasing the lock by the vacuum chuck 14d. As a result, it is possible to accurately correct the position of the wafer W while maintaining the relative position between the wafer W and the substrate holding unit 12.

According to the substrate processing apparatus 1 of the embodiment, when a chemical liquid is discharged from the chemical liquid nozzle 21 to the outer edge portion of the wafer W, the position of the wafer W is fixed with respect to the substrate holding unit 12 by the vacuum chuck 14w, and the position of the substrate holding unit 12 is fixed with respect to the rotation support unit 11 by the vacuum chuck 14d. As a result, it is possible to perform the processing of discharging a chemical liquid in a state where the wafer W is fixed at the correction position.

According to the substrate processing apparatus 1 of the embodiment, the detection unit 30 detects the outer edge portion of the wafer W over a plurality of places in the circumferential direction, and the drive unit 13 aligns the center position in the plane of the wafer W with the rotation axis of the rotation support unit 11 based on the positions in the circumferential direction of the plurality of places of the outer edge portion of the wafer W detected by the detection unit 30. As a result, the center position in the plane of the wafer W can be calculated more accurately, and the position of the wafer W can be corrected with high accuracy.

(Modification)

Next, a substrate processing apparatus 1a according to a first modification of the embodiment will be described with reference to FIGS. 7 to 8B. The substrate processing apparatus 1a of the first modification is different from that of the first embodiment described above in that the substrate processing apparatus 1a includes a detection unit 30a configured as an imaging device.

Figure 7:
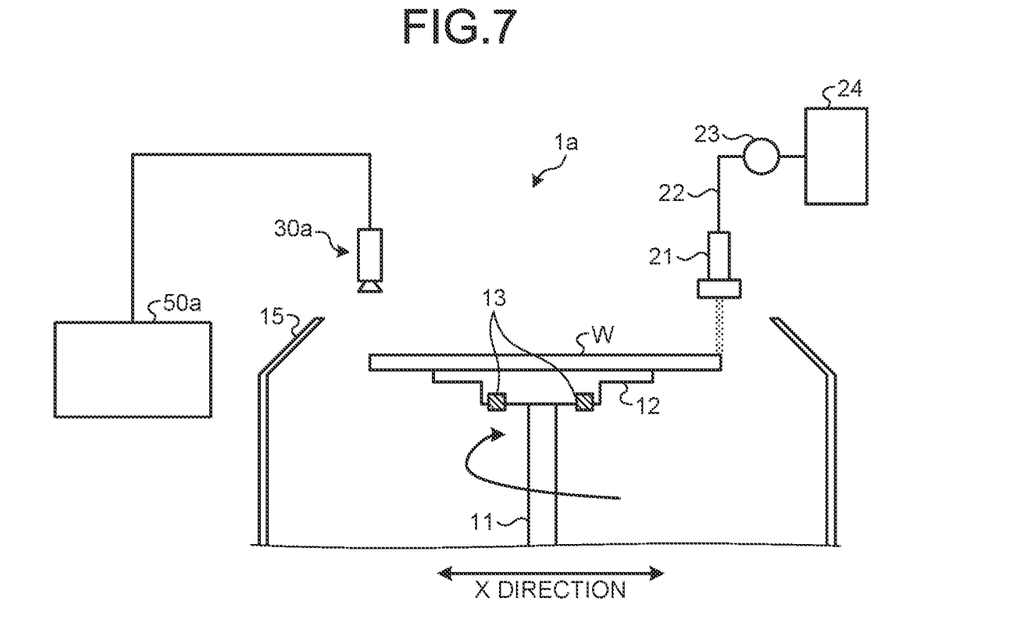
FIG. 7 is a diagram illustrating an example of a configuration of a substrate processing apparatus according to a first modification of the embodiment.

FIG. 7 is a diagram illustrating an example of a configuration of the substrate processing apparatus 1a according to the first modification of the embodiment. In FIG. 7, the same reference numerals are given to the same configurations as those of the above-described embodiment, and the description will be omitted.

As illustrated in FIG. 7, the substrate processing apparatus 1a includes the detection unit 30a arranged above the outer edge portion of the wafer W, and a control unit 50a that controls the detection unit 30a.

More specifically, the detection unit 30a is provided above the wafer W at a position away from the chemical liquid nozzle 21 in the circumferential direction of the wafer W. In the example of FIG. 7, the detection unit 30 is disposed at a position 180° away from the chemical liquid nozzle 21 in the circumferential direction of the wafer W, that is, at a position away from the chemical liquid nozzle 21 in the X direction with the substrate holding unit 12, the drive unit 13, the rotation support unit 11, and the like interposed therebetween.

The detection unit 30a as an imaging device is, for example, an image sensor such as a charge coupled device (CCD) or a complementary metal oxide semiconductor (CMOS). The detection unit 30a images the outer edge portion of the wafer W from above the wafer W, for example.

The control unit 50a controls the detection unit 30a to capture an image including the outer edge portion of the wafer W. Other configurations of the control unit 50a are similar to those of the control unit 50 of the above-described embodiment.

Figure 8A:
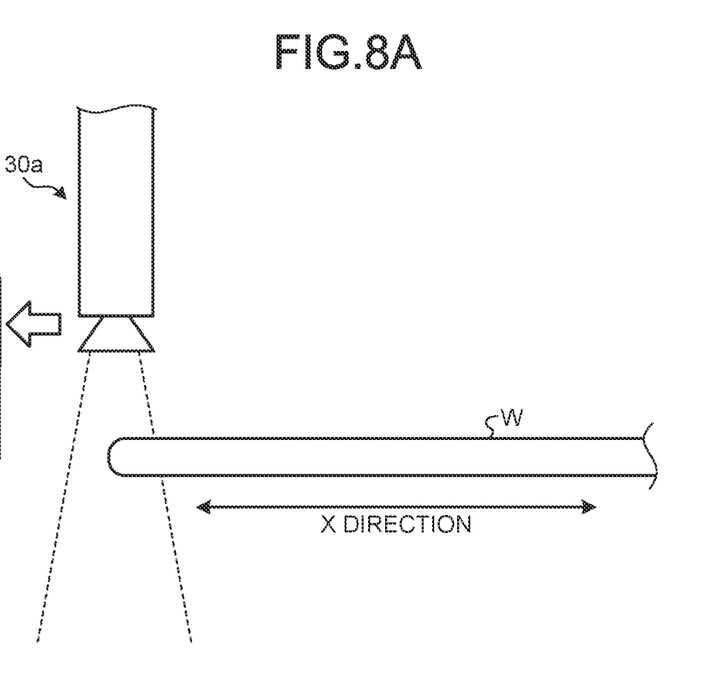
FIGS. 8A and 8B are diagrams illustrating an example of a method for detecting an outer edge portion of a wafer by a detection unit included in the substrate processing apparatus according to the first modification of the embodiment.
Figure 8B:
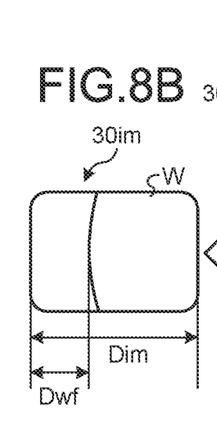

FIGS. 8A and 8B are diagrams illustrating an example of a method for detecting an outer edge portion of the wafer W by the detection unit 30a included in the substrate processing apparatus 1a according to the modification of the embodiment.

As illustrated in FIG. 8A, in detecting the outer edge portion of the wafer W, the control unit 50a acquires a captured image of the outer edge portion of the wafer W by the detection unit 30a from above the wafer W placed on the substrate holding unit 12. By narrowing the angle of view of the detection unit 30a mainly to the outer edge portion of the wafer W and performing imaging, high resolution can be obtained.

As illustrated in FIG. 8B, a captured image 30*im* captured by the detection unit 30*a* includes the wafer W occupying a predetermined area in the captured image 30*im* in accordance with the placement position of the wafer W in the substrate holding unit 12. The control unit 50*a* specifies the position of the outer edge portion of the wafer W based on a width Dwf in the X direction of the wafer W with respect to a width Dim in the X direction of the captured image 30*im*, that is, the width of the wafer W in the direction toward the center position in the plane direction of the substrate holding unit 12.

More specifically, the control unit 50 calculates the position of the outer edge portion of the wafer W in the X direction with respect to the detection unit 30 from the width Dwf of the wafer W in the X direction. In addition, the control unit 50*a* calculates the center position in the plane of the wafer W with respect to the rotation axis of the rotation support unit 11 from the position in the X direction of the outer edge portion of the wafer W with respect to the detection unit 30*a*.

At this time, by detecting the outer edge portion of the wafer W at a plurality of places in the circumferential direction of the wafer W, for example, at three or more places, the center position in the plane of the wafer W with respect to the rotation axis of the rotation support unit 11 can be calculated more accurately.

The substrate processing apparatus 1*a* of the modification has the same effects as those of the substrate processing apparatus 1 of the above-described embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
    a substrate holder that holds a substrate;
    a supporter including a rotary motor that supports the substrate holder and rotates the substrate held by the substrate holder in a circumferential direction;
    a driver that drives the substrate holder with respect to the supporter in a first direction and a second direction, the first direction extending along a plane of the substrate, the second direction extending along the plane of the substrate and intersecting the first direction;
    a detector that detects an outer edge portion of the substrate held by the substrate holder;
    a chemical liquid discharger that discharges a chemical liquid to the outer edge portion of the substrate held by the substrate holder;
    a controller configured to cause the driver to drive the substrate holder in the first direction and the second direction based on the outer edge portion detected by the detector in a manner that a center position in the plane of the substrate held by the substrate holder matches a rotation axis of the supporter; and
    vacuum chucks that fix a position of the substrate in the plane direction with respect to the substrate holder and fix a position of the substrate holder in the plane direction with respect to the supporter,
    wherein during a position correction processing of the substrate, the controller is configured to maintain the plane of the substrate along the first direction and the second direction by maintaining that the position of the substrate in the plane direction is fixed with respect to the substrate holder by the locking mechanism, and
    the supporter rotates the driver and the vacuum chucks with the substrate holder.

2. The substrate processing apparatus according to claim 1, wherein the vacuum chucks include
    a first vacuum chuck that fixes the position of the substrate in the plane direction with respect to the substrate holder, and
    a second vacuum chuck that fixes the position of the substrate holder in the plane direction with respect to the supporter.

3. The substrate processing apparatus according to claim 2, wherein
    the first vacuum chuck is a first chuck that extends from the supporter to the substrate holder, reaches a back surface of the substrate and chucks the substrate to the substrate holder.

4. The substrate processing apparatus according to claim 3, wherein
    the first chuck has flexibility in a connection portion between the supporter and the substrate holder.

5. The substrate processing apparatus according to claim 2, wherein
    the driver is fixed to the supporter, and
    the second vacuum chuck is a second chucking mechanism that extends from the supporter to the driver, reaches a back surface of the substrate holder and chucks the substrate holder to the driver.

6. The substrate processing apparatus according to claim 2, wherein
    in a meantime of detecting the outer edge portion by the detector and in a meantime of discharging the chemical liquid from the chemical liquid discharger to the outer edge portion, the controller is configured to fix the position of the substrate with respect to the substrate holder by the first vacuum chuck and fix the position of the substrate holder with respect to the supporter by the second vacuum chuck.

7. The substrate processing apparatus according to claim 2, wherein
    in a meantime of aligning the center position of the substrate and the rotation axis by the driver, the controller is configured to fix the position of the substrate with respect to the substrate holder by the first vacuum chuck and not fix the position of the substrate holder with respect to the supporter by releasing the second vacuum chuck.

8. The substrate processing apparatus according to claim 1, wherein the controller is configured to
    cause the detector to detect the outer edge portion at a plurality of places in the circumferential direction, and
    align the center position of the substrate and the rotation axis by the driver based on positions of the plurality of places of the outer edge portion detected by the detector.

9. The substrate processing apparatus according to claim 1, wherein the detector is a laser sensor including
    a light projector that projects laser light toward the outer edge portion, and
    a light receiver that receives the laser light projected from the light projector.

10. The substrate processing apparatus according to claim 9, wherein
the controller is configured to specify the center position of the substrate with respect to the rotation axis based on a width of the laser light received by the light receiver in a direction toward a center position in the plane direction of the substrate holder.

11. The substrate processing apparatus according to claim 1, wherein
the detector is an imaging device that takes an image of the outer edge portion.

12. The substrate processing apparatus according to claim 11, wherein
the controller is configured to specify the center position of the substrate with respect to the rotation axis based on a width, in a direction toward a center position in the plane direction of the substrate holder, of the substrate occupying the image of the outer edge portion taken by the imaging device.

13. The substrate processing apparatus according to claim 1, wherein
an area of a plane of the substrate holder on which the substrate is placed is smaller than an area of a discharge surface of the chemical liquid of the substrate.

14. The substrate processing apparatus according to claim 1, wherein
the chemical liquid discharger discharges at least one of a removal liquid for removing a film formed on the substrate from the outer edge portion and a raw material liquid as a raw material of a film to be formed on the outer edge portion.

* * * * *